United States Patent [19]

Furukawa

[11] Patent Number: 5,130,638
[45] Date of Patent: Jul. 14, 1992

[54] PORTABLE RECEIVER FOR DETECTING PROBE SIGNAL ON LOW VOLTAGE LINE CONDUCTOR

[75] Inventor: Toshiaki Furukawa, Saga, Japan

[73] Assignee: Kabushikikaisha Togamidenkiseisakusho, Saga, Japan

[21] Appl. No.: 624,111

[22] Filed: Dec. 7, 1990

[30] Foreign Application Priority Data

Dec. 8, 1989 [JP] Japan ............................... 1-142279

[51] Int. Cl.⁵ .......................................... G01R 19/00
[52] U.S. Cl. ...................................... 324/67
[58] Field of Search .................. 324/66, 67, 247, 529

[56] References Cited

U.S. PATENT DOCUMENTS 5,001,430 3/1991 Peterman et al. ...................... 324/67

Primary Examiner—Walter E. Snow
Attorney, Agent, or Firm—Dennis T. Griggs

[57] ABSTRACT

A receiver unit for use in a low voltage line conductor probing system is disclosed and comprises a receiver head attached to a receiver body, and at least one coil disposed in the receiver head for detecting the magnetic flux generated by an alternating current probing signal which is supplied to a pair of spaced line conductors connected to one of a plurality of electrical switching devices disposed in a panel board. The magnetic flux detecting coil produces a voltage signal which is a function of the magnitude of the detected magnetic flux. The magnetic flux detecting coil is adapted to produce a peak voltage when the receiver head is placed on a protective insulating housing of the panel board in alignment with the one electrical switching device with the coil positioned perpendicular to a reference plane containing the associated line conductors.

17 Claims, 6 Drawing Sheets

FIG. 1B
FIG. 1A
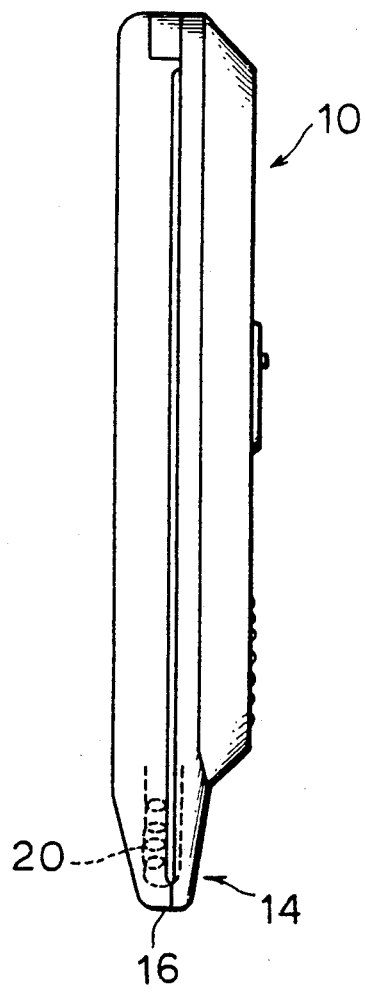
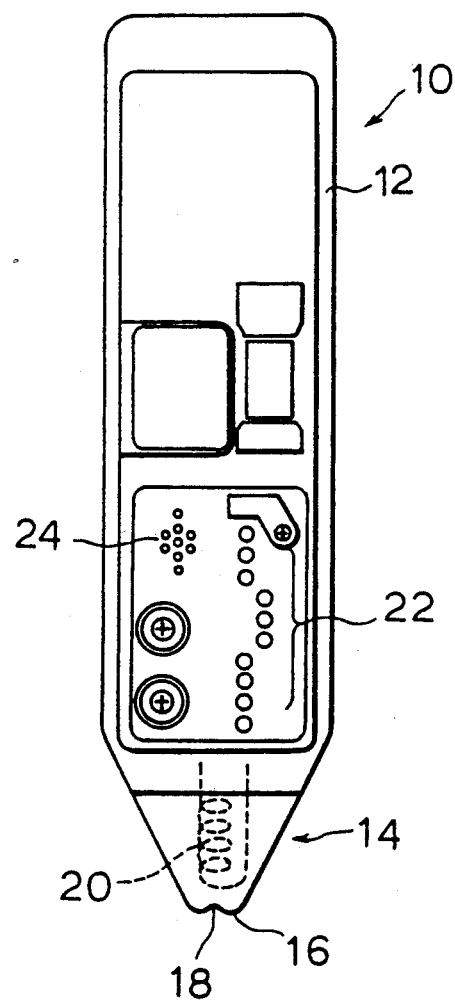

PORTABLE RECEIVER FOR DETECTING PROBE SIGNAL ON LOW VOLTAGE LINE CONDUCTOR

BACKGROUND OF THE INVENTION

The present invention relates to an improved receiver unit for use in a low voltage line conductor probe system.

Wiring systems comprising various cables and service lines exist in the interior of building structures such as, for example, plants and offices. Usually, service lines are branched off at different locations from the main line where panel boards are normally provided. Each panel board has a plurality of circuit breakers disposed therein. A main switch is inserted between the plurality of circuit breakers and low voltage service lines.

In performing the service of certain existing low voltage lines or the installation of additional receptacles to such lines, it is highly required that such low voltage service lines be disconnected from the main line for safety reasons. However, it is very difficult to determine which of circuit breakers in the panel board is electrically associated with the low voltage line to be serviced. One approach to solving this problem is to open the main switch to render all the associated lines conductors "dead". However, this results in shutting off of all electrical apparatus such as computers connected to the main switch. Accordingly, it is necessary to disconnect only the low voltage line conductors to be serviced while keeping the other lines live.

Japanese Laid Open Patent Application No. 62-261075 discloses a probe system for use with a multiple-conductor cable, which basically comprises a probe signal transmitter, a probe signal receiver including a probe coil and a display unit. The probe coil is in the form of a ring having one portion cut away to enable insertion of a conductor under test through the ring. In use of this probe system, the transmitter is connected to one end of the conductor to supply a probe signal thereto. The receiver is positioned at the other end of the cable in such a manner that the probe coil may detect the magnetic flux induced by the probe signal through the conductor.

The present invention contemplates the use of this prior art concept to determine which of circuit breakers in a panel board is electrically associated with a specific line conductor or conductors. Typically, the panel board has a protective insulating cover having openings through which operating knobs extend outwardly. The operating knobs are operatively associated with their respective circuit breakers in the panel board. In trying to determine which of the circuit breakers in the panel board is electrically associated with a particular line conductor, the line conductor is supplied with an electrical current having a predetermined frequency through a receptacle, while the panel board is probed for the magnetic flux generated by the current, by use of a flux detecting coil. During the probing operation, the protective insulating cover must not be removed from the remaining structure of the panel board to eliminate the possibility of accidental contact with energized portions in the panel board.

In case of such low voltage line conductor probing applications, it should be noted that the magnetic flux generated by the current flowing in the circuit breakers has a pattern which is different from that generated by the current through the multiple-conductor cable as described above. Each of the circuit breakers in the panel board has a pair of spaced conductors extending in parallel to each other, and the direction of AC current flowing through the spaced conductors is opposite to each other. In this arrangement, the direction of the magnetic flux generated around one of the conductors is different from that of the magnetic flux generated around the other conductor, as is well known to those skilled in the art. The magnetic flux generated by both conductors in an area located therebetween is oriented generally perpendicular to a "reference" plane in which both conductors lie. Accordingly, it should be understood that a simple application of the above-described prior art concept to this particular case will not provide an effective and efficient method of detection, since if the coil is positioned outside the protective insulating cover at a point midway between the conductors in parallel to the reference plane, the coil will produce no voltage signal. Thus, it is impossible to determine which of the circuit breakers in the panel board is electrically associated with the low voltage line conductors.

It is, accordingly, an object of the invention to provide a receiver unit for use in a low voltage line conductor probe system which can produce a peak voltage when the receiver unit is positioned on a panel board in alignment with the circuit breaker in the panel board that is electrically associated with a particular low voltage line conductor.

SUMMARY OF THE INVENTION

With this object in view, the present invention resides in a receiver unit for use in a low voltage line conductor probe system comprising a transmitter unit for supplying an alternating current having a predetermined frequency to a selected pair of low voltage line conductors, said selected pair of the line conductors being associated with one of circuit breakers disposed in a panel board, said receiver unit being capable of detecting the magnetic flux generated by said alternating current flowing through said spaced conductors. The receiver unit according to the invention includes a receiver head attached to a receiver body, and coil means disposed in said receiver head to detect the generated magnetic flux and to produce a voltage signal having a level which is a function of the strength of the detected magnetic flux, said coil means being adapted to produce a peak voltage when said receiver head is placed in alignment with a particular circuit breaker in the panel board with said coil means positioned perpendicular to the reference plane at a point midway between the line conductors associated with said particular circuit breaker.

In a preferred embodiment, the receiver head comprises means for indicating the orientation of said coil means. Preferably, the indicating means includes at least one abutment surface on the receiver head which is adapted to be placed in abutment with an outer surface on the panel board. The coil means may be in the form of a coil positioned perpendicular to said abutment surface of the receiver head for detecting the magnetic flux.

In another embodiment, the indicating means includes abutment surfaces on orthogonally disposed sides of the receiver head, and said coil means comprises a coil positioned perpendicular to one of said abutment surfaces of the receiver head.

In a still further embodiment, the coil means preferably comprises a pair of coils orthogonally disposed relative to each other and adapted to be selectively used by operation of a selector switch disposed on the receiver unit. One of the coils is oriented perpendicular to the abutment surface of the receiver head.

In a preferred embodiment, the receiver head is removably attached to said receiver body.

In a more preferred embodiment, the receiver head is provided with an opening within which a rotatable member is mounted for rotation and includes said coil means disposed therein.

Preferably, the receiver head is of T-shaped configuration and is pivotally connected to the receiver body.

In yet an even more preferred embodiment, a plurality of light emitting diodes and/or a single buzzer are associated with the coil and adapted to become activated in response to the voltgage output from the coil.

The invention also resides in a receiver unit for use in a low voltage line conductor probe system including a transmitter unit for supplying an alternating current having a predetermined frequency to a selected pair of low voltage line conductors, said selected pair of the line conductors being associated with one of circuit breakers disposed in a panel board, said receiver unit being capable of detecting the magnetic flux generated by said alternating current flowing through said spaced line conductors. The receiver unit of the invention comprises a receiver head attached to a receiver body, and coil means in the form of a pair of aligned coils for detecting the magnetic flux and for producing an voltage signal having a level which is a function of the strength of detected magnetic flux, said coils being adapted to produce a peak voltage when said pair of coils is placed in alignment with the pair of the electrical conductors, and with the pair of coils positioned in parallel to said reference plane.

Preferably, the receiver head comprises means for indicating the orientation of said coil means.

In a preferred embodiment, the coils are connected in series with each other and are oppositely wound so that the coils can produce a voltage signal of same phase.

In another embodiment, the coils are connected in series with each other and wound in same direction, the connections therebetween being reversed so that the coils can produce a voltage signal of the same phase.

The coils are selectively used by operation of a selector switch depending on whether circuit breakers or a single electrical conductor is probed.

In a still further embodiment, the receiver head comprises a pair of fixed and movable head portions each having a coil disposed therein, said movable head portion being connected to the receiver body to provide for pivotal movement between an extended position in which said movable head portion is positioned parallel to the fixed receiver head portion and a retracted position in which the fixed receiver head portion is received in the receiver body, said coils being adapted to be selectively used by operation of a limit switch which is automatically opened as the movable head portion is received in the receiver body, thereby causing the coil in the fixed position to become activated.

BRIEF DESCRIPTION OF THE DRAWINGS

The invention will become more apparent by reading the following detailed description in conjunction with the accompanying drawings, wherein like reference numerals refer to corresponding or like parts throughout the drawings in which:

FIG. 1A is a front elevational view of a receiver unit for use in a low voltage line conductor probe system according to one embodiment of the invention, showing a magnetic flux detecting coil by the dotted lines, with internal electrical connections omitted for clarity.

FIG. 1B is a side elevational view of the receiver unit of FIG. 1A, showing the magnetic flux detecting coil by the dotted lines.

DETAILED DESCRIPTION OF THE PREFERRED EMBODIMENTS

Figure 2:
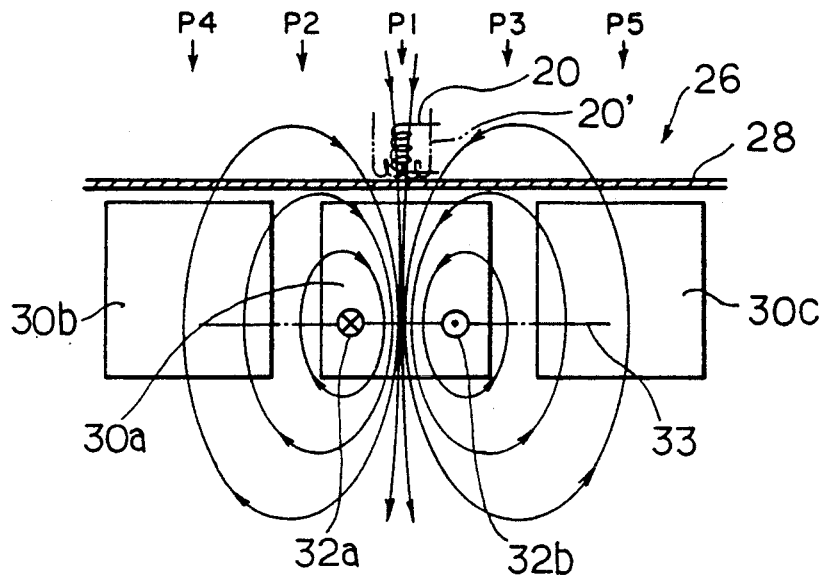
FIG. 2 is a schematic view of the receiver unit of the invention in its operative position, showing the detecting coil by the solid line which is oriented perpendicular to a "reference plane" in which a pair of line conductors lie and also a receiver coil of the conventional receiver unit by the dotted lines.

Referring now to the drawings, and particularly to FIGS. 1A and 1B, there is shown a compact or handheld receiver unit 10 as constructed in accordance with a preferred embodiment of the present invention. As shown, the receiver unit 10 is an essential part of the low voltage line conductor probe system and may be designed for use with electrical devices such as panel boards.

The compact receiver unit 10 of the invention includes a generally rectangular main body or housing 12 and a generally triangular head portion 14 which, in this embodiment, is made integral with the housing 12 at its one end. However, the geometry of the unit 10 is not essential to the present invention and may be of any suitable configuration. The receiver head portion 14 may have a distal or front abutting surface 16 which is generally perpendicular to the longitudinal axis of the unit 10 and which is preferably provided centrally with a recess 18 for enabling easy placement of the unit with respect to a panel board.

As shown by the dotted lines in FIGS. 1A and 1B, a coil 20 is disposed centrally within the receiver head portion 14 of the receiver unit 10 with its axis being substantially perpendicular to the plane of the surface 16 thereof. The coil 20 is electrically connected with indicator means such as light emitting diodes (LED's) 22 and a buzzer 24 on the receiver body 12, in a conventional manner. The LED's may be in any suitable number. The electrical connection between these components is provided in the receiver body 12, but is omitted for the sake of clarity of illustration.

The receiver unit 10 is tuned to the particular frequency of an AC signal which is generated by a transmitter unit (not shown) and injected into a selected line conductor. As a result, the coil 20 can produce a voltage output which varies as a function of the intensity of the magnetic field detected thereby. The voltage output from the coil 20 is coupled to the LED's 22 in such a manner that the LED's of the number corresponding to the intensity of the magnetic field are activated. The buzzer 24 may be provided for redundancy and may preferably of the type capable of producing sound in a volume corresponding to the intensity of the magnetic field detected by the coil 20.

Referring to FIG. 2, the receiver unit 10 of the present invention is shown in an operative position relative to a panel board 26 (only a portion of which is shown in section). Only the magnetic field detecting coil 20 of the unit 10 is schematically shown for clarity of illustration. The panel board 26 has a protective insulating cover 28 and a plurality of circuit breakers 30a, 30b and 30c contained therein. At its respective load end, each of the circuit breakers 30a–c has a pair of parallel, spaced conductors 32a and 32b which are associated with low voltage electrical lines (not shown). It should be noted that a common plane 33 (referred to hereinafter as "reference plane") in which the conductors 32a and 32b lie is in parallel with the plane of the protective insulating cover 28. For purposes of ease of illustration, let it be assumed that one of the circuit breakers, for example the centrally disposed circuit breaker 30a, is associated with a selected set of lines being additionally supplied with an alternating current (AC) signal from its associated transmitter unit (not shown). It is essential that the AC signal supplied to the selected lines has a predetermined frequency different from that of the power frequency, for example 50 Hz. As the additional AC signal is added to the selected set of line conductors when the lines are hot, the parallel conductors 32a and 32b in the circuit breaker 30a will carry a current signal of the predetermined frequency changing in direction alternately with time.

Assuming that at a given time, due to the additional probe current flowing through the conductors 32a and 32b in opposite directions, as indicated by the marks "X" and ".", in the respective circular conductor sections, respectively, the characteristic magnetic flux lines are produced about the conductors, which are oriented in opposite directions to each other. Generally, by the mark "X" it is meant that the current is directed into the plane of that figure whereas the mark "." means that the current is directed out of the figure plane. In the illustrated embodiment, the direction of the magnetic flux lines induced about the conductor 32a are clockwise, whereas that of the magnetic flux lines about the conductor 32b is counter-clockwise. As a result, the magnetic field is of the highest intensity in a region between the conductors 32a and 32b.

In operation, the low voltage line conductors are supplied with the alternative probe current from the transmitter unit of the probe system. The receiver unit 10 can be aligned substantially directly with one of the circuit breakers, for example 30a, in the panel board 26 by noting an associated operating lever (not shown) projecting from the panel board. When the surface 16 of the receiver head 14 is brought into abutment with the protective cover 28 of the panel board 26, the magnetic flux detecting coil 20 in the receiver unit 10 will be positioned substantially equidistant from the probe current carrying conductors 32a and 32b and generally perpendicular to the reference plane 33. This position of the receiver head portion 14 is labeled as "P1" in FIG. 2. Since the circuit breaker 30a is associated with the lines being energized, the coil 20 when positioned in the "P1" position will produce a peak voltage in response to the highly concentrated magnetic flux lines detected thereby, which will result in activation of a number, for example ten, of LED's 22.

In case where the coil is laterally displaced to a position indicated by "P2" or "P3", the direction of magnetic flux lines generated by the current flowing through the conductor 32a is generally horizontal. In other words, when the coil is moved to the positions "P2" and "P3", the direction of the magnetic flux penetrating the coil is perpendicular to the axis thereof. Since there is very little net area to interact with the magnetic field, the coil will produce only a very small voltage drop across it resulting in no activation of the indicator means. As the coil 20 is further moved laterally to a position indicated by "P4" or "P5" in which the magnetic flux lines are oriented at an angle with the axis of the coil, it will produce a voltage of greater magnitude, thereby activating a few LED's.

Figure 3A:
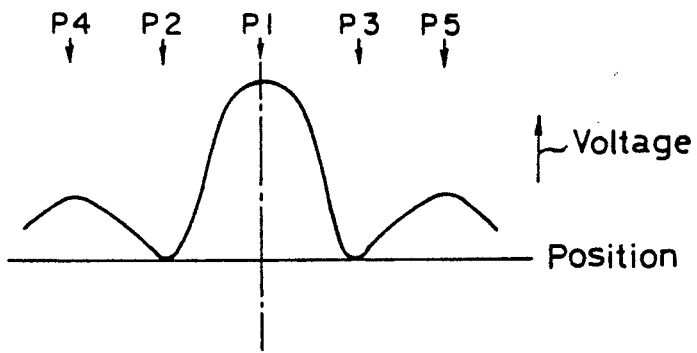
FIG. 3A is a schematic view showing the voltage generated by the magnetic flux detecting coil of the present invention as a function of the position thereof relative to a panel board.

FIG. 3A illustrates the relationship between the voltage output of the detecting coil 20 and the position thereof relative to the particular circuit breaker in the panel board. It will be understood that by detecting the peak voltage from the coil, it is possible to determine the identity of the circuit breaker being probed without the need for removal of the protective cover of the panel board.

Figure 3B:
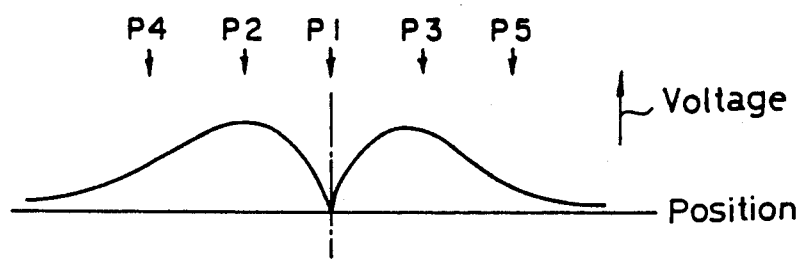
FIG. 3B is a schematic view similar to FIG. 3A, but showing the voltage generated by the magnetic flux detecting coil of the conventional type as a function of the position thereof relative to a panel board.

FIG. 2 also illustrates the use of a conventional receiver unit in place of the unit according to the present invention. As shown by the numeral 20', the coil is positioned with its axis parallel to the plane of the protective cover 28 of the panel board 26. When the coil 20' of the conventional type is in the "P1" position, the coil 20' produces little or substantially no voltage drop across it because the magnetic flux generated by the probe currents flowing through the conductors 32a and 32b acts to cancel each other. When the coil 20' is in the "P2" or "P3" position in which it is disposed midway between the circuit breakers 30b and 30a or 30a and 30c, the maximum voltage is induced therein as shown in FIG. 3B. Accordingly, it is difficult to positively determine which of the circuit breakers 30a–c in the panel board 26 is being probed.

From the foregoing, it will be appreciated that in probing the low voltage line conductors, the magnetic flux detecting coil may advantageously be positioned perpendicular to the protective cover of the panel board and thus the reference plane in which the circuit breaker conductors associated with the line conductors lie.

Figure 4:
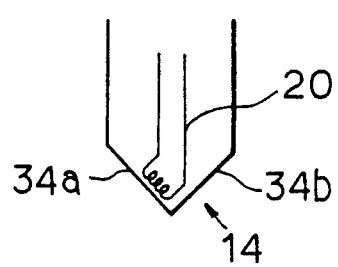
FIG. 4 is a schematic view of a second embodiment of the invention wherein a single magnetic flux detecting coil is disposed in parallel to one of abutment surfaces on the receiver head.

FIG. 4 illustrates a modified or second embodiment of the invention which differs from that of FIG. 1 in that the receiver head portion 14 has a pair of orthogonally disposed abutment surfaces 34a and 34b. As shown, the receiver coil 20 is located parallel to one of the abutment surfaces, for example 34a, of the receiver head portion 14. This embodiment of the receiver unit can be used not only for the electrical devices such as the panel board as described above but also for individual line conductors through which alternating current flows. In case of the former, the receiver head 14 should be placed such that the reference surface 34b thereof is in abutment with the protective cover 28 of the panel board 26. In case of the latter, the reference surface 34a should be disposed over the single line conductor to be probed with the coil 20 being positioned perpendicular to the length of the conductor.

Figure 5:
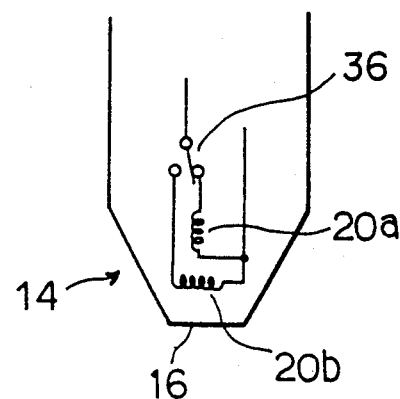
FIG. 5 is a schematic view of a third embodiment, showing a pair of orthogonally disposed magnetic flux detecting coils which are adapted to be selectively used by operation of a selector switch.

FIG. 5 illustrates a third embodiment which differs from the first embodiment of the invention in the provision of a pair of orthogonally disposed coils 20a and 20b in the receiver unit head portion 14. In this embodiment, one of the coils 20a is disposed perpendicular to the reference surface 16 whereas the other coil 20b is in parallel to the surface 16. The coils 20a and 20b are adapted to be selectively utilized by operation of a manually operated selector switch 36.

Figure 6:
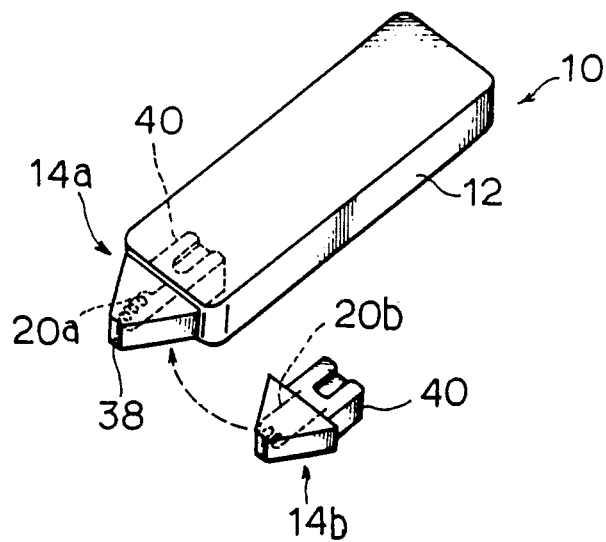
FIG. 6 is a perspective view of a receiver unit according to a fourth embodiment of the invention, showing separate and different receiver head portions removably attached to the receiver unit.

Referring now to FIG. 6, there is shown a perspective view of a fourth embodiment of the invention. A receiver head portion 14a is removably attached to the main body 12 of the receiver unit 10. The head 14a has a reference surface 38 and a connecting lug 40 which is fitted in a recess provided in the receiver body 12. A coil 20a is disposed perpendicular to the reference surface 38 of the head portion 14a. Another receiver head portion 14b is similar to the head portion 14a except that a coil 20b is positioned parallel to the reference surface 38. Thus, when it is desired to probe individual line conductors, the head 14b can be replaced by the head 14a.

Figure 7:
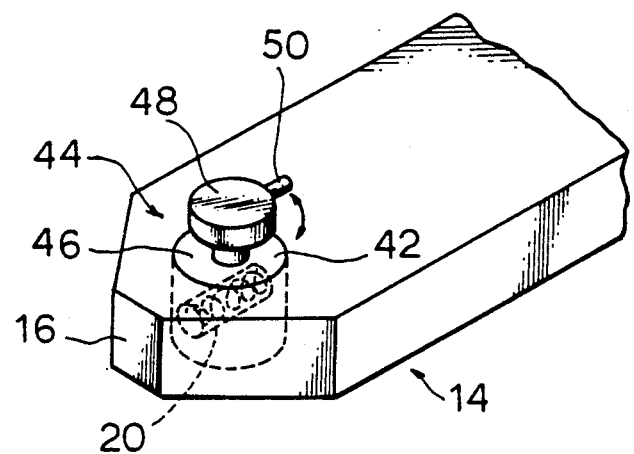
FIG. 7 is a perspective view of a fifth embodiment of the invention in which a rotatable member with the magnetic flux detecting coil incorporated therein is rotatably mounted within a circular recess in the receiver head portion.

FIG. 7 shows a fifth embodiment of the invention in which the receiver head 14 is provided with a circular opening 42 within which is mounted a rotatable member 44. The rotatable member 44 comprises a cylindrical body 46 in which the magnetic flux detecting coil 20 is located. A manually operated circular knob 48 is secured to the cylindrical body 46 and projects upwardly from the upper surface of the receiver head portion 14. The circular knob 48 is provided at a point along its circumference with indicator means 50 in the form of a pin which provides an indication of the orientation of the magnetic flux detecting coil 20 relative to the reference surface 16 of the receiver head portion 14. The coil 20 can be positioned either parallel or perpendicular to the head abutment surface 16 by manually rotating the member 44 through 90 degrees in a clockwise or counter-clockwise direction.

Figure 8:
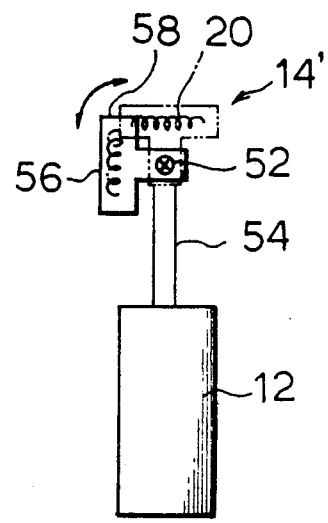
FIG. 8 is a schematic view of a seventh embodiment of the invention, showing a receiver head portion pivotally connected to the receiver body through a rigid elongated member.

FIG. 8 illustrates a sixth embodiment which differs from the embodiments described above in that a T-shaped receiver head portion 14' is pivotally connected at 52 to a rigid tubular member 54 mounted to the receiver main body 12. The head 14' has a first reference surface 56 which is located parallel to a single coil 20 in the head 14' and a second reference surface 58 which is oriented perpendicular to the first reference surface 56 and thus to the coil 20. The receiver head portion 14' can be rotated such that the coil 20 can be positioned either parallel or perpendicular to the object to be probed. Alternatively, the rigid tubular member may be replaced by a flexible member which can be swung so that the coil 20 can be positioned either parallel or perpendicular to the object to be probed.

Figure 9:
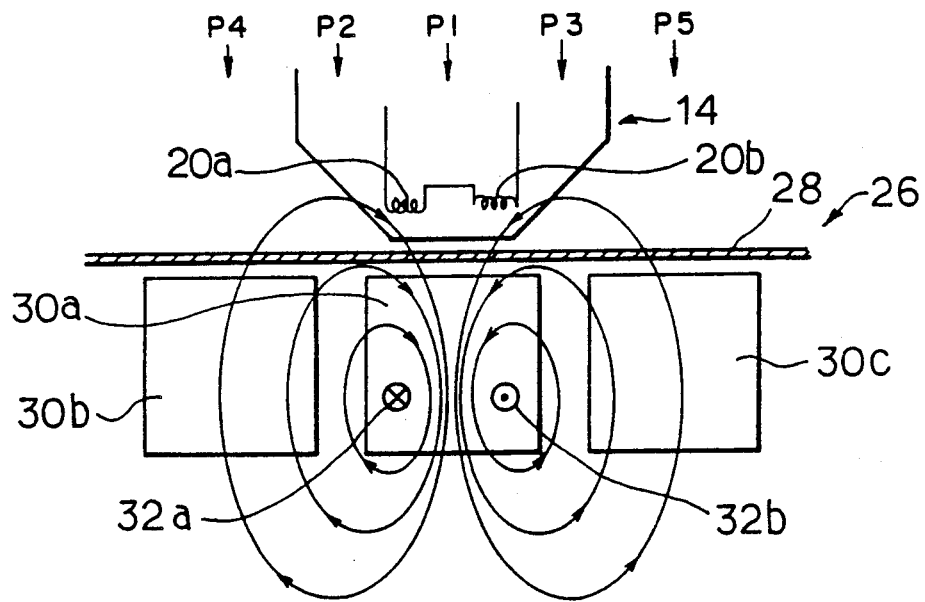
FIG. 9 illustrates a still further embodiment of the invention in its operative position, showing a pair of detecting coils connected in series with each other and oriented parallel to a "reference plane" in which a pair of line conductors lie.

FIG. 9 illustrates still another or a seventh embodiment of the invention. As shown, a pair of spaced coils 20a and 20b are connected in series with each other and disposed in parallel to the reference surface 16. However, the coils 20a and 20b are wound in opposite directions. It is desirable that the spacing between the coils 20a and 20b is approximately equal to that of the conductors 32a and 32b so that the coils may be brought into alignment with the conductors, respectively.

Figure 10A:
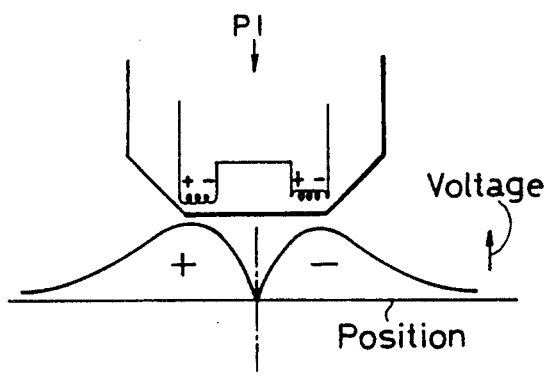
FIGS. 10A, 10B and 10C illustrate, respectively, the relationship between the magnetic flux generated by the coil and the position thereof relative to a circuit breaker in a panel board.
Figure 10B:
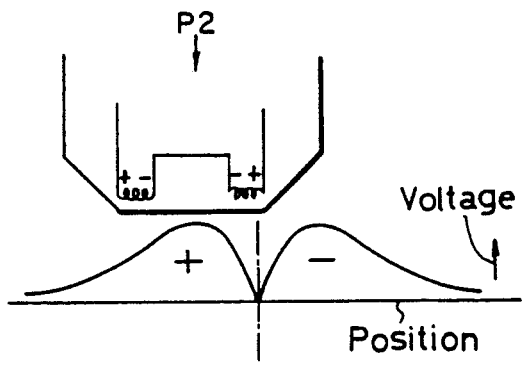
Figure 10C:
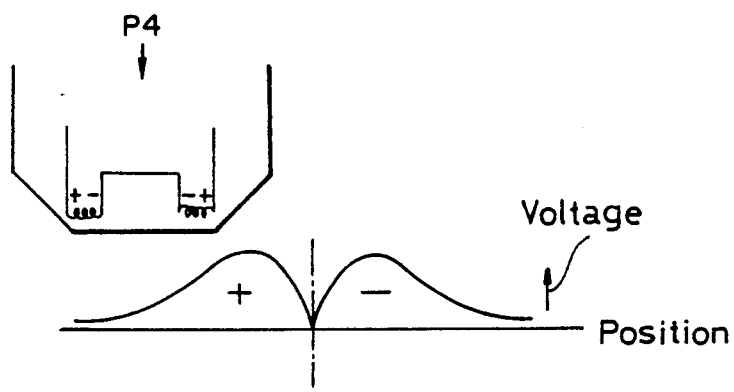

When the receiver head portion 14 of the receiver unit becomes aligned generally with the centrally disposed circuit breaker 30a as shown in FIGS. 9 and 10A, the coils 20a and 20b are positioned in opposing relationship to the conductors 32a and 32b of the circuit breaker 30a, respectively. In this position which corresponds to "P1" position shown in FIG. 2, a peak voltage is generated which is the sum of the voltage induced by the coil 20a and that by the coil 20b. When the receiver head portion 14 is laterally displaced to a position corresponding to the "P2" position of FIG. 2, as shown in FIG. 10B, the coils are energized by the magnetic flux of the same polarity and strength, and accordingly, the voltage of the same amplitude but of different polarity is induced in the coils 20a and 20b due to the oppositely wound coils. As a result, the net voltage across the coils is substantially zero. When the receiver head portion 14 is laterally displaced further to a position corresponding to "P4", as shown in FIG. 10C, the direction of the magnetic flux interacting the coil 20a is the same as that of the magnetic flux interacting the coil 20b but the intensity of the magnetic field generated by the coil 20a is different from that of the magnetic field induced by the coil 20b. Thus, the net coil voltage is substantially equal to the difference between the the voltages of opposite signs induced in the coils 20a and 20b.

Figure 11:
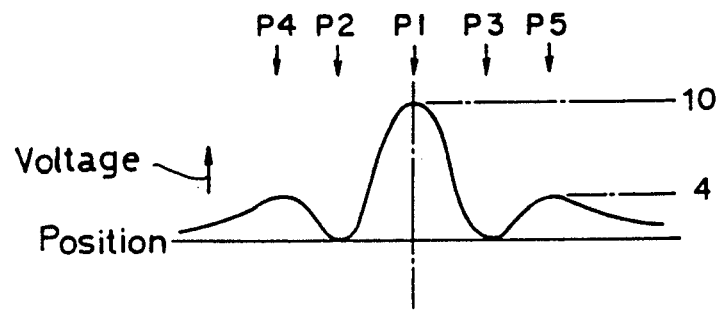
FIG. 11 is a schematic view similar to FIG. 3A, but showing the relationship between the voltage generated by the magnetic flux detecting coils of the FIG. 9 embodiment and the position thereof relative to a panel board.

FIG. 11 is a plot showing the relationship between the net voltage output of the detecting coils 20a and 20b and the position thereof relative to the particular circuit breaker in the panel board. The detection of a peak voltage output from the coil indicates that it becomes aligned with the circuit breaker within the panel board being probed.

Figure 12:
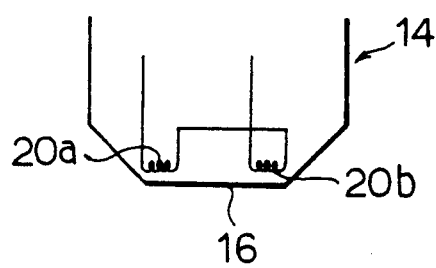
FIG. 12 is a schematic view of an eighth embodiment which is different from the FIG. 9 embodiment in that the connection of one of the magnetic flux detecting coils to the other is reversed.

FIG. 12 is a schematic diagram of an eighth embodiment of the invention which is similar to the FIG. 9 embodiment except for the manner of connection between the coils 20a and 20b. In this embodiment, the complicated process of fabricating the oppositely wound coils can be avoided by reversing the connection of the coil 20b to the coil 20a so as to perform the same function as in the embodiment of FIG. 12.

Figure 14:
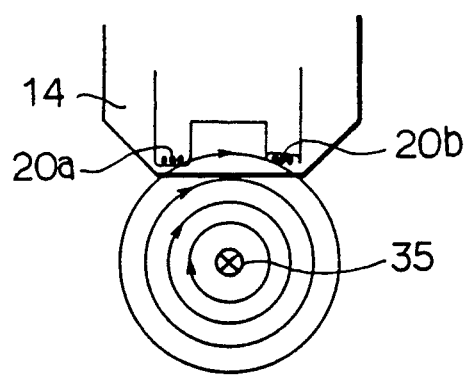
FIG. 14 illustrates the receiver head of FIG. 9 in its operative position relative to a single electrical conductor through which an alternating current flows.

The embodiments of FIGS. 9 and 12 can be satisfactorily used in probing panel boards having a plurality of circuit breakers therein, but it may not be preferable to use these embodiments to probe a group of line conductors. For example, referring to FIG. 14, the alternating current flows through a conductor 35 in one direction as indicated by the mark "X" and induces the magnetic field about the conductor 35. Because of the coils 20a and 20b being oppositely wound, the net voltage will be the difference between the voltages generated by the coils 20a and 20b. Thus, the net voltage generated by the coils may be reduced to zero when the coils are positioned in the region of the conductor 35. As the coils 20a and 20b are moved away from the conductor 35, the output voltage will become higher, making it difficult to determine which of the conductors is being probed.

Figure 13:
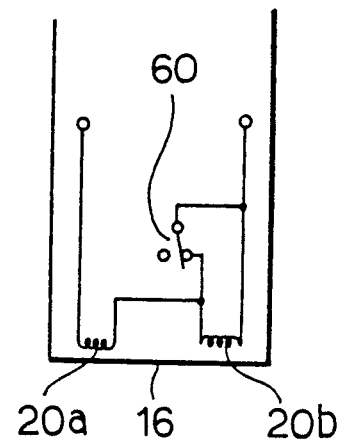
FIG. 13 is a schematic view similar to FIG. 9, but showing a ninth embodiment in which the magnetic flux detecting coils are adapted to be selectively used by operation of a selector switch.

FIG. 13 illustrates a ninth embodiment which differs from the embodiments of FIGS. 9 and 12 in the provision of a selector switch 60 which enables use of both the coils 20a and 20b simultaneously or the coil 20a alone as the case may be. For use with panel boards having circuit breakers therein, the selector 60 can be manually opened to connect the coil 20a in series with the coil 20b. Of course, for probing individual line conductors, the selector switch 60 may be closed to short circuit the coil 20b.

Figure 15:
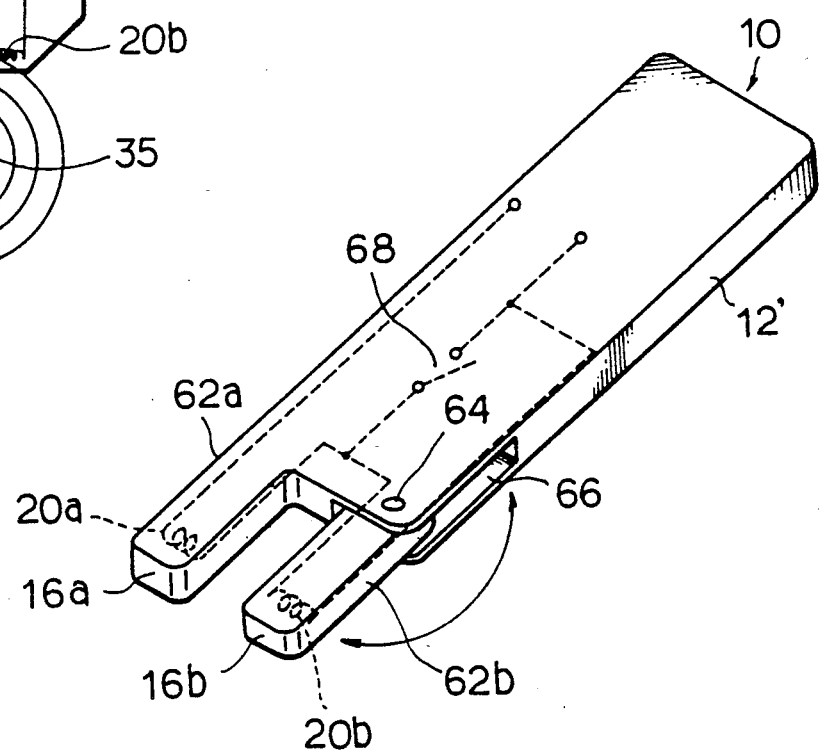
FIG. 15 is a schematic perspective view of a tenth embodiment of the invention which comprises a pair of fixed and movable head portions.

FIG. 15 illustrates a final or tenth embodiment of the invention. The receiver unit 10 comprises a pair of fixed and movable head portions 62a and 62b. The fixed head 62a is formed integrally with the receiver body 12. The movable head portion 62b is pivotally connected to the receiver body 12 by a pivot pin 64. A 180 degrees rotation of the movable head portion 62b about the pivot pin 64 from the position shown in FIG. 15 will bring the movable head into an inoperative position in a recess 66 provided in the receiver body 12. A limit switch 68 is provided for automatically disconnecting the coil 20b in response to the movable head 62b moving into the inoperative position in the recess 66 of the receiver body 12. The operation of this embodiment is similar to that of the FIG. 13 embodiment except that the movable head portion 62b is retracted into the recess 66 of the receiver body 12 when the receiver unit is used for a single line conductor.

From the foregoing, it is apparent that the present invention provides a unique, compact receiver unit for a low voltage line conductor probing system. The receiver unit of the invention is constructed such that coil means can produce a peak voltage when it is aligned with a particular circuit breaker in a panel board being supplied with an alternating probe current, thereby making it possible to determine which of the circuit breakers is being supplied with the probe current. The receiver unit of the invention can also be used for a single line conductor by using only one coil means to determine whether it is being supplied with such an alternating probe current.

Many features and advantages of the invention will be apparent from the detailed description of the specification and, thus, it is intended by the appended claims to cover all such features and advantages of the invention which fall within the true spirit and scope thereof. Further, since numerous modifications and changes will readily occur to those skilled in the art, it is not desired to limit the invention to the exact construction and operation disclosed, and accordingly all suitable modifications and equivalents may be resorted to falling within the scope of the invention.

What is claimed is:

1. In a low voltage line conductor probe system wherein an alternating current probe signal is supplied to a selected pair of low voltage line conductors, said selected pair of low voltage line conductors being associated with one of a plurality of electrical switching devices disposed adjacent to each other within a panel board, said electrical switching devices each having a pair of spaced electrical conductors associated with said pair of line conductors and extending in parallel to each other so as to define a reference plane containing said line conductors, and including a receiver unit for detecting the magnetic flux generated by said alternating current probe signal flowing through said spaced line conductors, said receiver unit comprising, in combination:

a receiver body, a receiver head attached to said receiver body, and coil means disposed in said receiver head for detecting said magnetic flux and producing a voltage signal having a level corresponding to the intensity of the detected magnetic flux, said coil means producing a peak voltage across it when said receiver head is placed on said panel board in alignment with a selected electrical switching device being supplied with an alternating current probe signal, perpendicularly to said reference plane and at a midway point between the line conductors associated with said selected electrical switching device; and, said receiver head including a pair of fixed and movable head portions each having said coil means disposed therein, said movable head portion being connected to the receiver body for pivotal movement between an extended position in which said movable head portion is positioned parallel to the fixed receiver head portion and a retracted position in which the movable receiver head portion is received in the receiver body, said coil means being adapted to be selectively used by operation of a limit switch which is automatically opened as the movable head portion is received in the receiver body, thereby causing only the coil means in the fixed head portion to become activated.

2. The receiver unit as recited in claim 1, wherein said receiver head comprises first indicator means for indicating the orientation of said coil means.

3. The receiver unit as recited in claim 2, wherein said first indicator means includes at least one abutment surface on the receiver head which is adapted to be placed in abutment with an outer surface of the panel board, said coil means comprising a coil disposed perpendicular to said abutment surface of the receiver head for detecting the magnetic flux.

4. The receiver unit as recited in claim 2, wherein said first indicator means includes orthogonally disposed abutment surfaces on both sides of the receiver head, said coil means comprising a coil disposed perpendicular to one of said abutment surfaces of the receiver head.

5. The receiver unit as recited in claim 1, wherein said coil means comprises a pair of coils orthogonally disposed relative to each other and adapted to be selectively used by operation of a selector switch disposed on the receiver unit.

6. The receiver unit as recited in claim 5, wherein one of said coils is oriented perpendicular to said abutment surface of the receiver head.

7. The receiver unit as recited in claim 1, wherein said receiver head is removably attached to said receiver body.

8. The receiver unit as recited in claim 2, wherein said receiver head is provided with an opening within which a rotatable member is mounted for rotation, said coil means being disposed in said rotatable member.

9. The receiver unit as recited in claim 8, wherein said first indicator means comprises a pin fixedly attached to said rotatable member for indicating the orientation of the coil means.

10. The receiver unit as recited in claim 1, wherein said receiver head is of T-shaped configuration and is pivotally connected to the receiver body.

11. The receiver unit as recited in any of claims 1-10, further comprising second indicator means associated with said coil means and adapted to become activated in response to the voltage output from said coil means.

12. The receiver unit as recited in claim 11, wherein said second indicator means includes a plurality of light emitting diodes and/or a single buzzer.

13. In a low voltage line conductor probe system wherein an alternating current probe signal is supplied to a selected pair of low voltage line conductors, said selected pair of line conductors being associated with one of a plurality of electrical switching devices disposed adjacent to each other within a panel board, said electrical switching devices each having a pair of electrical conductors associated with said pair of line conductors and extending in parallel to each other with a first spacing therebetween so as to define a reference plane containing said line conductors, and including a receiver unit for detecting the magnetic flux generated by said alternating current probe signal flowing through said spaced line conductors, said receiver unit comprising, in combination:

a receiver body, a receiver head attached to said receiver body, and coil means, said coil means comprising a pair of coils disposed in alignment with, and at a second spacing from, each other in the receiver head, said coils being adapted to detect the generated magnetic flux to causae a voltage drop across it that is a function of the detected magnetic flux, said second spacing of the coils being generally equal to said first spacing of the line conductors, wherein said voltage drop shows a peak value when said pair of coils are placed in alignment with said pair of line conductors with the coils positioned in parallel to said reference plane; and, said receiver head including a pair of fixed and movable head portions each having said coil means disposed therein, said movable head portion being connected to the receiver body for pivotal movement between an extended position in which said movable head portion is positioned parallel to the fixed receiver head portion and a retracted position in which the movable receiver head portion is received in the receiver body, said coil means being adapted to be selectively used by operation of a limit switch which is automatically opened as the movable head portion is received in the receiver body, thereby causing only the coil means in the fixed head portion to become activated.

14. The receiver unit as recited in claim 13, wherein said receiver head comprises first means for indicating the orientation of said coil means.

15. The receiver unit as recited in claim 13, wherein said coils are connected in series with each other and are wound in opposite directions to each other.

16. The receiver unit as recited in claim 13, wherein said coils are connected in series with each other and wound in the same direction.

17. The receiver unit as recited in claim 14, wherein said coils are adapted to be selectively used by operation of a selector switch depending on whether what is probed is electrical switching devices or a single line conductor.

* * * * *